US009024350B2

(12) United States Patent
Loh

(10) Patent No.: US 9,024,350 B2
(45) Date of Patent: May 5, 2015

(54) LED LIGHT MODULE

(76) Inventor: Ban P Loh, San Jose, CA (US)

( * ) Notice: Subject to any disclaimer, the term of this patent is extended or adjusted under 35 U.S.C. 154(b) by 586 days.

(21) Appl. No.: 13/019,900

(22) Filed: Feb. 2, 2011

(65) Prior Publication Data

US 2011/0193109 A1 Aug. 11, 2011

Related U.S. Application Data

(60) Provisional application No. 61/302,474, filed on Feb. 8, 2010, provisional application No. 61/364,567, filed on Jul. 15, 2010.

(51) Int. Cl.

| | |
|---|---|
| ***H01L 33/00*** | (2010.01) |
| ***F21V 29/00*** | (2006.01) |
| ***F21K 99/00*** | (2010.01) |
| *F21Y 101/02* | (2006.01) |

(52) U.S. Cl.
CPC . *F21V 29/22* (2013.01); *F21K 9/30* (2013.01); *F21Y 2101/02* (2013.01)

(58) Field of Classification Search
USPC ...................... 257/98, 99, E33.058, E33.066, 257/E33.067, E33.072, E33.075
See application file for complete search history.

(56) References Cited

U.S. PATENT DOCUMENTS

| | | | | |
|---|---|---|---|---|
| 7,852,015 | B1 * | 12/2010 | Yen et al. | 315/291 |
| 8,373,991 | B2 * | 2/2013 | Fann et al. | 361/710 |
| 2005/0211992 | A1 * | 9/2005 | Nomura et al. | 257/79 |
| 2006/0056213 | A1 * | 3/2006 | Lee et al. | 363/144 |
| 2007/0063321 | A1 | 3/2007 | Han | |
| 2007/0200133 | A1 | 8/2007 | Hashimoto | |
| 2007/0243645 | A1 | 10/2007 | Lin | |
| 2008/0089072 | A1 * | 4/2008 | Kim et al. | 362/294 |
| 2008/0283861 | A1 | 11/2008 | Loh | |

FOREIGN PATENT DOCUMENTS

KR 1020090003378 A 1/2009

* cited by examiner

*Primary Examiner* — Victor A Mandala

(57) ABSTRACT

A light emitting module is disclosed. The light emitting module includes a lead frame body, lead frame, a heat spreader, an intermediate heat sink, and at least one light emitting element (LED). The lead frame body defines a cavity which accurately registers the heat spreader and includes optical or reflective walls surrounding the light emitting elements soldered on metallized traces of the heat spreader. The lead frame body encases and supports portions of the lead frame. The lead frame extends from outside the body into the cavity to accurately align with solder pads of the heat spreader. All the pre-aligned mechanical, thermal and electrical contacts are then soldered by solder reflow process under tight environmental control to prevent damage to the light emitting element. A robust, healthy 3-dimensional optical-electro-mechanical assembly having a very low thermal resistance in a thermal path from its light emitting element to its intermediate heatsink is created.

12 Claims, 12 Drawing Sheets

LED LIGHT MODULE

CROSS REFERENCE TO RELATED APPLICATIONS

This patent application claims the benefit of priority under 35 USC sections 119 and 120 of U.S. Provisional Patent Application No. 61/302,474 filed Feb. 8, 2010, the entire disclosure of which is incorporated herein by reference. This patent application claims the benefit of priority under 35 USC sections 119 and 120 of U.S. Provisional Patent Application No. 61/364,567 filed Jul. 15, 2010, the entire disclosure of which is incorporated herein by reference. The applicant claims benefit to Feb. 8, 2010 as the earliest priority date.

BACKGROUND

The present invention relates to light emitting devices. More particularly, the present invention relates to light emitting device modules and lighting devices.

Light emitting diodes (LEDs) are typically made using semiconducting material doped with impurities to create a P-N junction. When electrical potential (voltage) is applied to the P-N junction current flows through the junction. Charge-carriers (electrons and holes) flow in the junction. When an electron meets a hole, it falls into a lower energy level, and releases energy in the form of light (photon, radiant energy) and heat (phonon, thermal energy).

In most applications, light is the desired form of energy from an LED and heat is not desired. This is because heat can and often causes permanently damages to the LED, degrades LED performance by causing decreased light output, and leads to a premature device failure.

However, in the current state of art, generation of undesired heat cannot be avoided. A typical high power LED chip of 1 $mm^2$ in area and 0.10 mm in thickness has a P-N junction active layer of only 0.003 mm thick. Yet, it can convert 1 to 2 watts of electrical energy into both radiant and thermal energy. More than 50% of electrical energy is actually converted into thermal energy which can heat up the whole LED within fraction of a second. Typically, such LED operates at a junction temperature of 120 degrees Celsius. That is, these LEDs operate at a temperature greater than the temperature of boiling water (water boils at 100° C.). Above 120 degrees C., the LED's forward voltage will increase, thus resulting in higher power consumption. Also, its luminous output will drop correspondingly and its reliability and life expectancy will also be adversely affected.

The problem of heat is even more apparent for high power LEDs. There is an increasing demand for increasingly brighter LEDs. To make brighter LEDs, the most obvious solution is to increase the electrical power applied to the LEDs. This however leads to LEDs operating at even greater temperatures. As the operating temperature increases, the efficiency of the LEDs decreases, resulting in light output that is less than expected or desired. That is, for example only, doubling the electrical power of the LED does not result in the generation of twice the amount of light. Rather, the light output is much less than the expected twice the luminosity.

The problem of heat is compounded by the way in which the LEDs are packaged within light emitting devices such as light bulbs. Light emitting devices of current art (using LEDs as the core of the device) often entrap heat within the device itself. This decreases the expected life of the LED and of the device itself. For example, many LEDs in the marketplace are sold as having expected operating life of 50,000 hours (at which time the LED output declines to seventy percent of its original output). However, light emitting devices (having such LEDs as the light emitting element of the device) typically specifies only 35,000 hours of expected operating life).

Accordingly, there remains a need for an improved LED module that eliminates or alleviates these problems associated with heat.

SUMMARY

The need is met by the present invention. In a first embodiment of the present invention, a light emitting module is disclosed. The light emitting module includes a lead frame body, lead frame, a heat spreader, and at least one light emitting element placed on the heat spreader. The lead frame body defines a cavity. A first portion of the lead frame is encased within the lead frame body wherein the lead frame body provides structural support and separation of leads of the lead frame. The heat spreader is positioned at least partially within the cavity of the lead frame body. The heat spreader is connected to the lead frame. At least one light emitting element is placed on the heat spreader such that heat generated by the light emitting element is drawn away from the light emitting element by the heat spreader.

In various embodiments, the light emitting module may include any one or more the following characteristics in any combination: The lead frame body defines a reflective surface surrounding the cavity. The lead frame includes at least two electrical conductors. The lead frame is electrically connected to the light emitting elements on the heat spreader. A snap in body engaging second portion of the lead frame. The lead frame body includes a first major surface, the first major surface defining a first plane, and wherein the lead frame is bent relative to the first plane.

The heat spreader includes a ceramic substrate and a metal trace layer fabricated on the substrate. The substrate has a first major surface and a second major surface opposite the first major surface. The metal trace is adaptable for attaching light emitting element as well as for attaching the lead frame.

In an alternative embodiment of the heat spreader, the heat spreader includes a metallic substrate, a first dielectric layer above the metallic substrate, a second dielectric layer below the metallic substrate, a metal trace layer fabricated on the first dielectric layer, a metal layer fabricated below the second dielectric layer, and metal trace adaptable for attaching light emitting element as well as attaching the lead frame.

The light emitting element may include light emitting junction diode encased within resin. Alternatively, the light emitting element may include light emitting diode chip.

In a second embodiment of the present invention, a light emitting module is disclosed. The module includes lead frame, lead frame body, and a heat spreading light emitting component. The lead frame includes electrical conductors. The lead frame body encases first portion of the lead frame providing mechanical support to the lead frame. The lead frame body defines a cavity. The heat spreading light emitting component includes a thermally conductive substrate having a first major surface, and electrical traces on the first major surface of the substrate. The light emitting element mounted on the substrate is electrically connected to its metallized electrical traces. The lead frame is electrically connected to the metallized electrical traces of the first major surface of the heat spreader.

In a third embodiment of the present invention, a heat spreader apparatus is disclosed. The heat spreader includes a metallic substrate, a first dielectric layer above the metallic substrate, a second dielectric layer below the metallic substrate, a metal trace layer fabricated on the first dielectric layer, a metal layer fabricated below the second dielectric layer. The metal trace is adaptable for attaching light emitting element and adaptable for attaching the lead frame. The metallic substrate may include Aluminum. The first dielectric layer may include Aluminum oxide. The second dielectric layer may include Aluminum oxide.

In a third embodiment of the present invention, a light emitting subassembly is disclosed. The subassembly includes an intermediate heat sink and at least one light emitting module mounted on the intermediate heat sink. The light emitting module includes a lead frame body defining a cavity, lead frame wherein first portions of the lead frame are encased within the lead frame body, a heat spreader positioned at least partially within the cavity of the lead frame body, the heat spreader connected to the lead frame, and at least one light emitting element placed on the heat spreader. The heat spreader is mechanically and thermally connected to the intermediate heat sink by a robust solder joint covering its entire bottom surface area.

In the subassembly, intermediate heat sink defines slots for engagement with the light emitting module. The intermediate heat sink includes a reflective top surface.

DETAILED DESCRIPTION

The present invention will now be described with reference to the Figures which illustrate various aspects, embodiments, or implementations of the present invention. In the Figures, some sizes of structures, portions, or elements may be exaggerated relative to sizes of other structures, portions, or elements for illustrative purposes and, thus, are provided to aid in the illustration and the disclosure of the present invention.

This patent application claims the benefit of priority of and incorporates by reference the entirety of U.S. Provisional Patent Application No. 61/302,474 filed Feb. 8, 2010 and U.S. Provisional Patent Application No. 61/364,567 filed Jul. 7, 2010. Each of these incorporated provisional applications includes drawings and specifications including figure designations, reference numbers, and descriptions corresponding to the figure designations and to the reference numbers. To avoid confusion and to discuss the inventions with even more clarity, the figure designations and reference numbers used in the incorporated documents are not used in this document. Rather, in this document, new figure designations, reference numbers, and descriptions corresponding to the figure designations are used.

Figure 1:
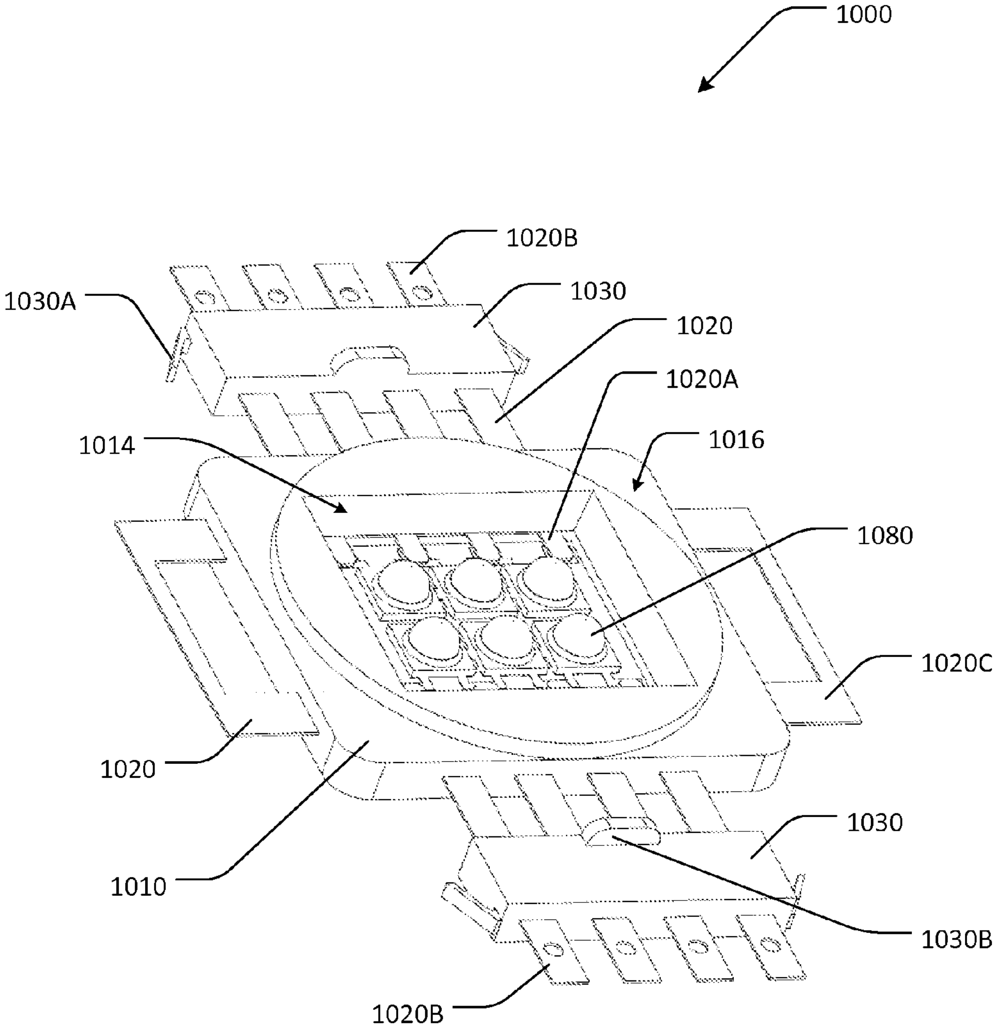
FIG. 1 illustrates a top perspective view of a light emitting module in accordance of one embodiment of the present invention.
Figure 2:
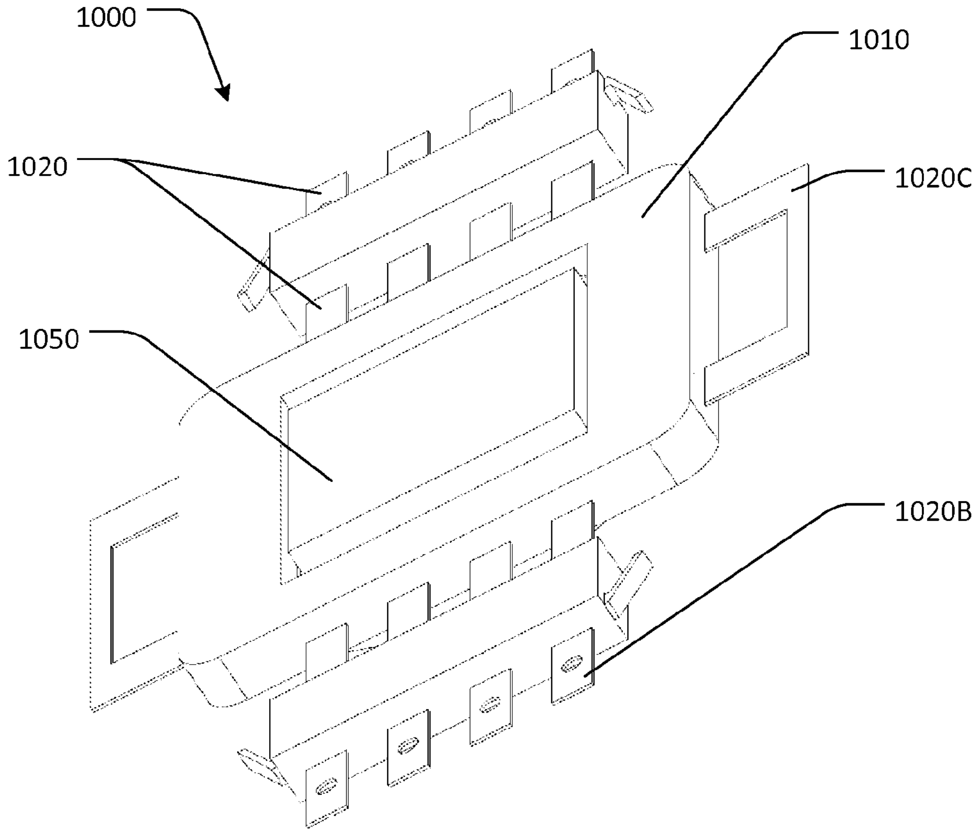
FIG. 2 illustrates a bottom perspective view of the light emitting module of FIG. 1.
Figure 3:
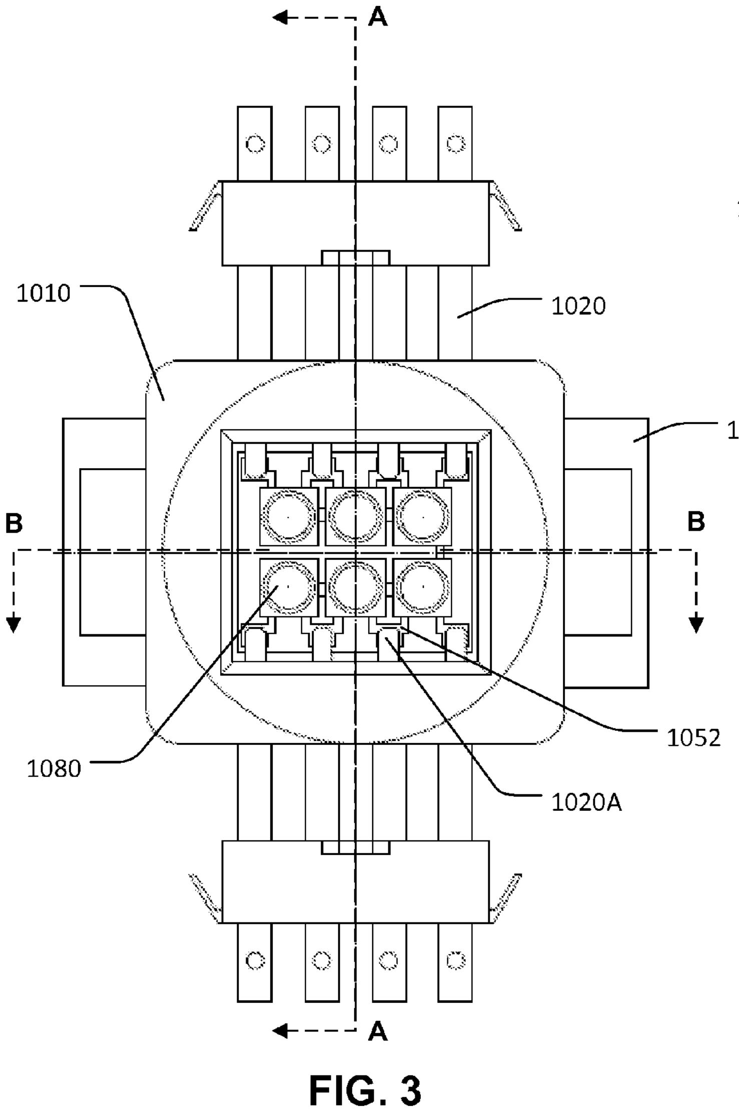
FIG. 3 illustrates a top view of the light emitting module of FIGS. 1 and 2.
Figure 4:
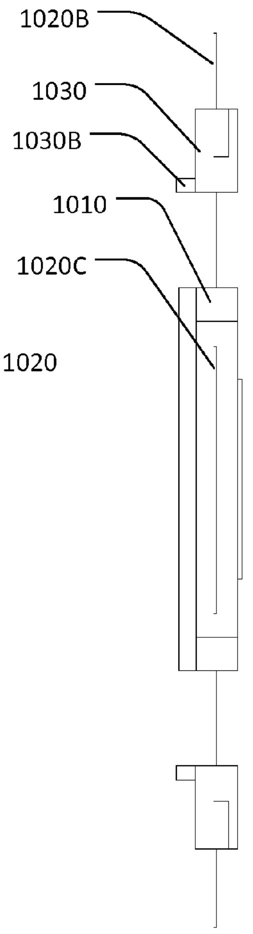
FIG. 4 illustrates a first side view of the light emitting module of FIGS. 1 through 3.
Figure 5:
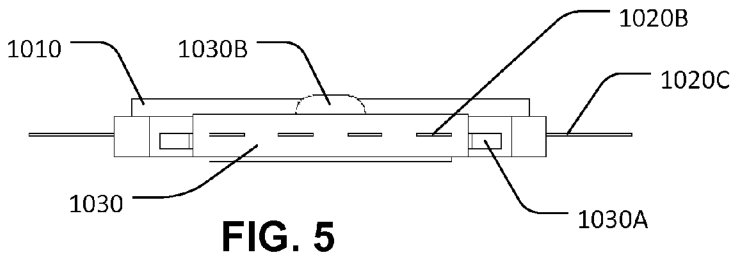
FIG. 5 illustrates a second side view of the light emitting module of FIGS. 1 through 3.
Figure 6:
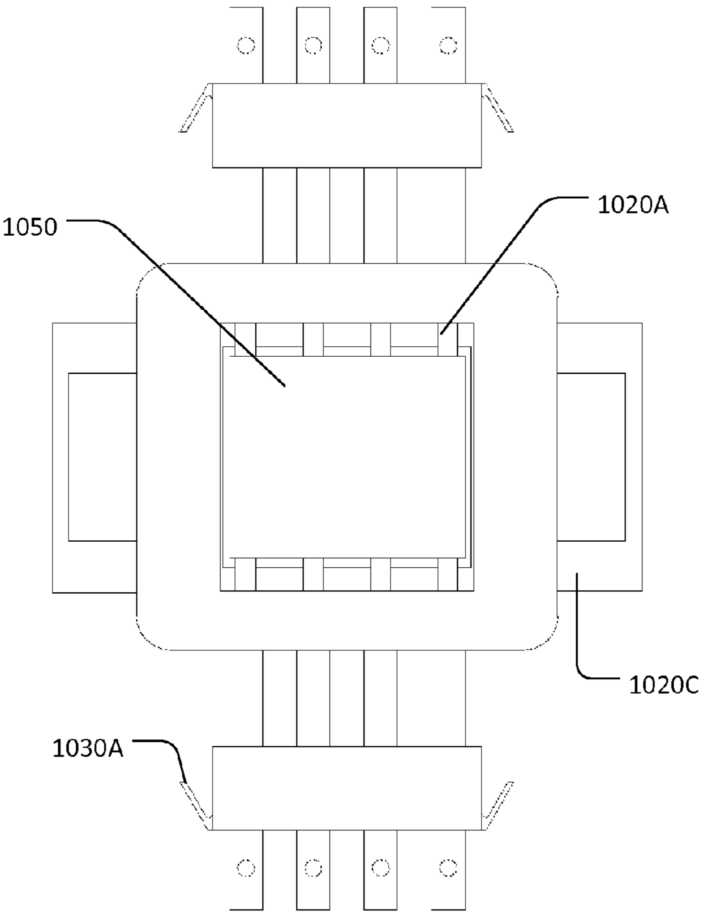
FIG. 6 illustrates a bottom view of the light emitting module of FIGS. 1 and 2.
Figure 7:
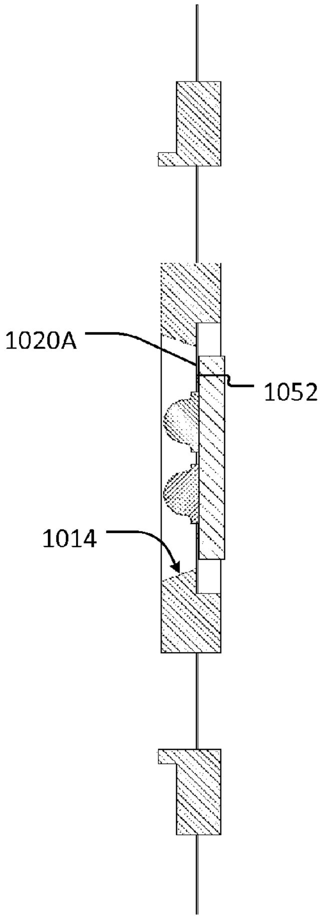
FIG. 7 illustrates a cut away side view of the light emitting module of FIGS. 1 through 3 cut along line A-A of FIG. 3.
Figure 8:
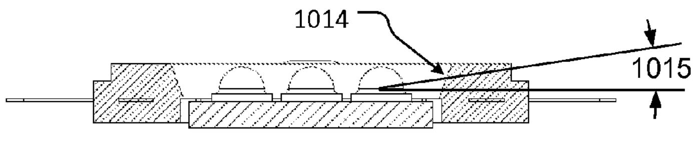
FIG. 8 illustrates a cut away side view of the light emitting module of FIGS. 1 through 3 cut along line B-B of FIG. 3.
Figure 9:
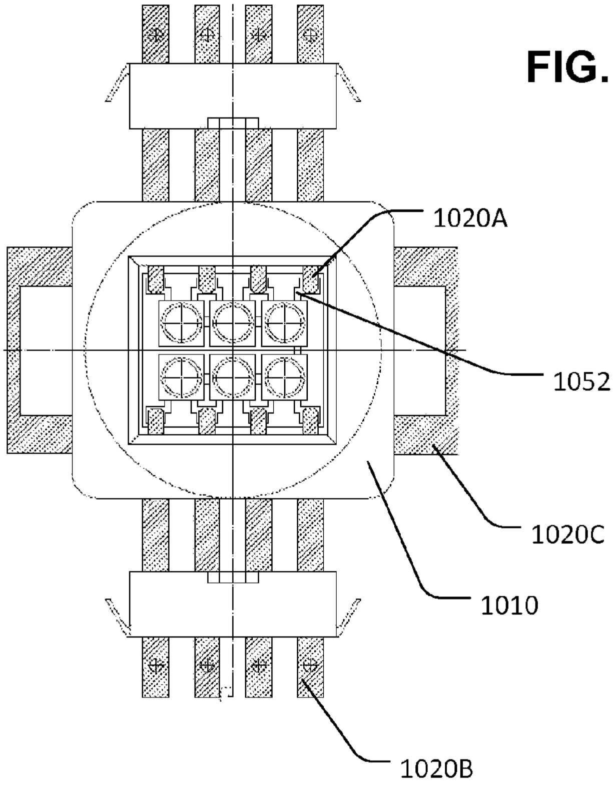
FIG. 9 is another illustration of the top view of the light emitting module of FIGS. 1 and 2 with portions of the light emitting module highlighted.
Figure 10:
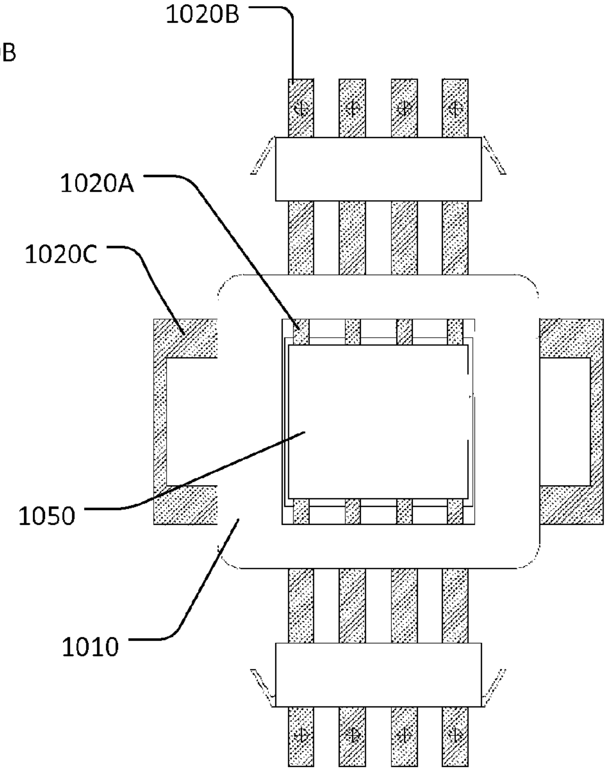
FIG. 10 is another illustration of the bottom view of the light emitting module of FIGS. 1 and 2 with portions of the light emitting module highlighted.

FIG. 1 illustrates a top perspective view of a light emitting module 1000 in accordance of one embodiment of the present invention. FIG. 2 illustrates a bottom perspective view of the light emitting module 1000 of FIG. 1. FIG. 3 illustrates a top view of the light emitting module 1000 of FIGS. 1 and 2. FIG. 4 illustrates a first side view of the light emitting module 1000 of FIGS. 1 through 3. FIG. 5 illustrates a second side view of the light emitting module 1000 of FIGS. 1 through 3. FIG. 6 illustrates a bottom view of the light emitting module 1000 of FIGS. 1 and 2. FIG. 7 illustrates a cut away side view of the light emitting module 1000 of FIGS. 1 through 3 cut along line A-A of FIG. 3. FIG. 8 illustrates a cut away side view of the light emitting module 1000 of FIGS. 1 through 3 cut along line B-B of FIG. 3. FIG. 9 is another illustration of the top view of the light emitting module 1000 of FIGS. 1 and 2 with portions of the light emitting module 1000 highlighted. FIG. 10 is another illustration of the bottom view of the light emitting module 1000 of FIGS. 1 and 2 with portions of the light emitting module 1000 highlighted.

Figure 11:
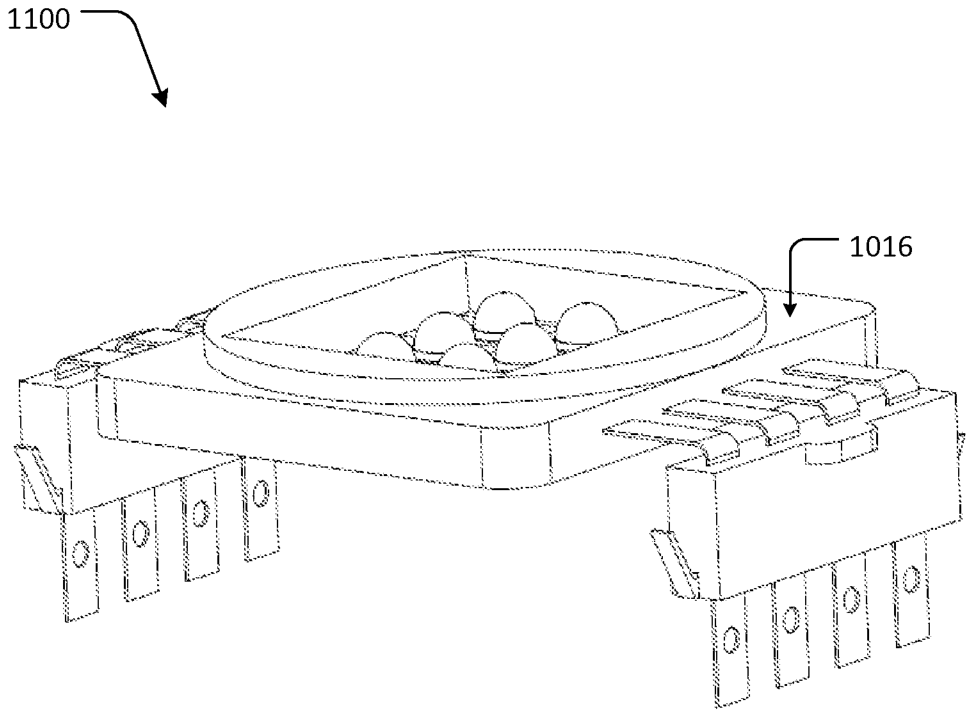
FIG. 11 illustrates a top perspective view of a light emitting module in accordance of another embodiment of the present invention.
Figure 12:
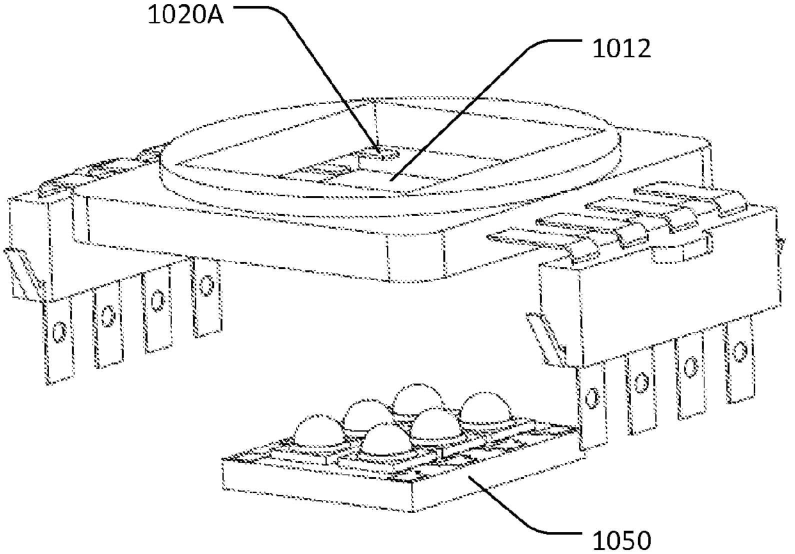
FIG. 12 illustrates a partially exploded top perspective view of the light emitting module of FIG. 11.
Figure 13:
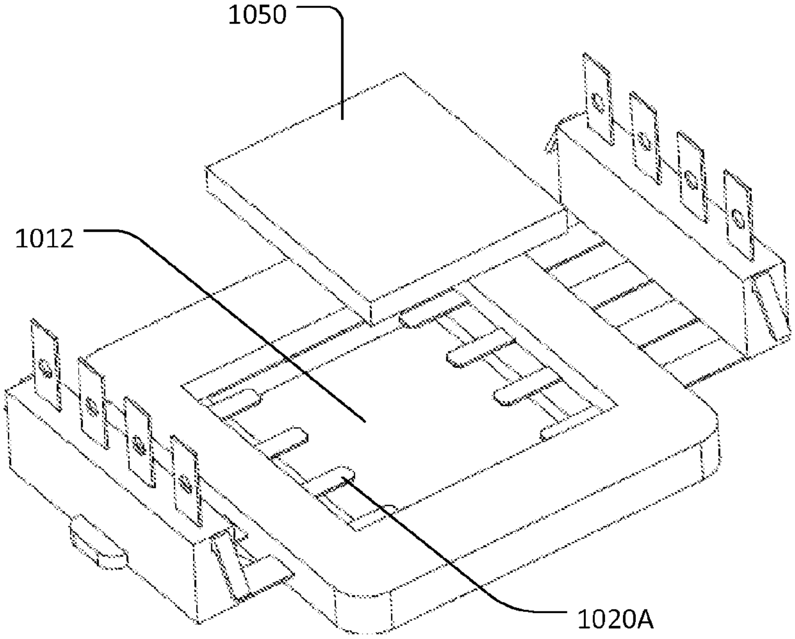
FIG. 13 illustrates a partially exploded bottom perspective view of the light emitting module of FIG. 11.
Figure 14:
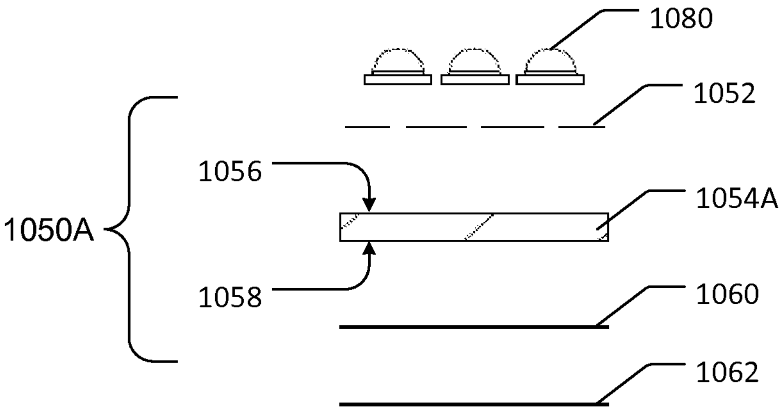
FIG. 14 illustrates an exploded side view of a first alternative embodiment of a portion of the light emitting module.
Figure 15:
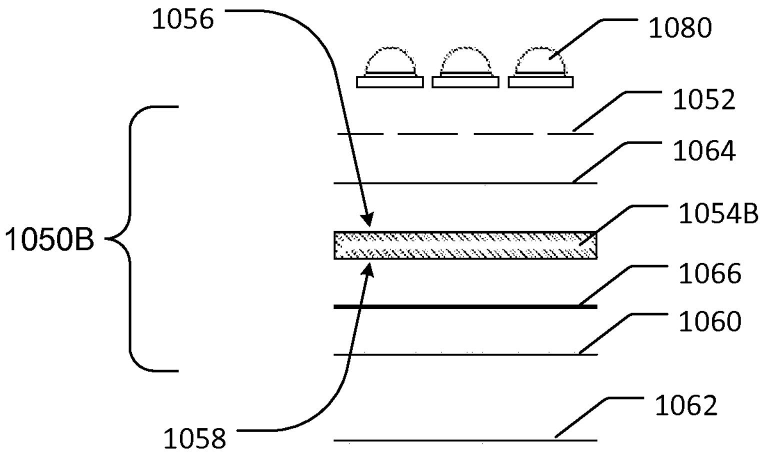
FIG. 15 illustrates an exploded side view of a second alternative embodiment of a portion of the light emitting module.

FIG. 11 illustrates a top perspective view of a light emitting module 1100 in accordance of another embodiment of the present invention. The light emitting module 1100 has the same components and elements as the light emitting module 1000 of FIGS. 1 through 10 with portions in a different configuration. FIG. 12 illustrates a partially exploded top perspective view of the light emitting module 1100 of FIG. 11. FIG. 13 illustrates an exploded bottom prospective view of a first alternative embodiment of a portion of the light emitting module 1100 of FIG. 12. FIG. 14 illustrates an exploded side view of a first alternative embodiment of a portion of the light emitting module 1100 of FIG. 12. FIG. 15 illustrates an exploded side view of a second alternative embodiment of a portion of the light emitting module 1100 of FIG. 12.

That is, FIGS. 1 through 10 illustrate different views of the light emitting module 1000 of the present invention. FIGS. 11 and 12 illustrate the light emitting module 1000 in a different configuration and referred to as light emitting module 1100. To avoid duplicity and confusion, and to increase clarity, in the Figures, not every referenced portion is annotated in every Figure.

Referring to FIGS. 1 through 13, in one embodiment of the present invention, the light emitting module 1000 includes a lead frame body 1010, lead frame 1020, at least one heat spreader 1050, and at least one light emitting element 1080 placed on the heat spreader 1050.

Lead Frame Body

The lead frame body 1010 is typically molded plastic but can be any other material. The lead frame body 1010 defines a cavity 1012 within which the heat spreader 1050 is accurately positioned. The body cavity 1012 is most clearly illustrated in FIGS. 12 and 13. In the illustrated embodiment, the heat spreader 1050 is mostly or entirely within the body cavity 1012 (best illustrated in FIGS. 12 and 13); however, in other embodiments, the heat spreader 1050 may be only partially concealed inside the body cavity 1012. The lead frame body 1010 can be made from thermoplastic or thermoset plastics which can withstand high temperatures over 200 C for a short period of time. In any event, the body cavity 1012 is large enough to expose the light emitting element 1080 while providing mechanical and structural support to the lead frame 1020.

The lead frame body 1010 defines reflector surface 1014 surrounding the body cavity 1012. In the illustrated embodiment, the body cavity 1012 has a substantially rectangular shape. Accordingly, the lead frame body 1010 defines four reflector surfaces 1014. However, that the number of rectangular surfaces may vary depends on the shape of the body cavity 1012. The reflector surface 1014 surrounds the body cavity 1012 wherein the light emitting elements 1080 are placed. Consequently, the reflector surface 1014 reflects and redirects light (directed to it from the light emitting elements 1080) toward a desired direction. The light directed to the reflector surface 1014 are at a very low angle (illustrated as angle 1015 in FIG. 8) and is lost in the prior art devices which are typically MCPCB (metal-core printed circuit board) or PCB (printed circuit board) having non-reflective flat surfaces. Consequently, the luminous efficiency of the module is higher than that of the prior art.

In the illustrated embodiment, the reflectivity of the reflector surface 1014 is greater than 85 percent. To realize the reflective surface 1014, the lead frame body 1010 may include high temperature thermoplastics or thermoset plastics that are loaded with reflective materials such as, for example only, Titanium Dioxide ($TiO_2$), Barium Sulfate ($BaSO_4$), and others. In one embodiment, the material used for the lead frame body 1010 is a Polyphthalamide (also known as PPA, High Performance Polyamide) with trade name as Amodel which has a reflectivity of 90 percent with a low percentage of scattering.

Lead Frame

The lead frame 1020 may, but is not required to, include multiple leads, portions, or both as illustrated. In the illustrated embodiment, the lead frame 1020 is used to conduct electrical power and is a stamped metal such as, for example only, copper or other metal alloy. The stamped metal can be, for example, sheet metal.

In the illustrated embodiment, the lead frame 1020 includes four leads extending from outside the lead frame body 1010, through the substance of the lead frame body 1010, and into the body cavity 1012. In the body cavity 1012, the lead frame 1020 makes contact with the heat spreader 1050. Consequently, in the illustrated embodiment, the lead frame body 1010 encases the portion of the lead frame 1020 that lies within the lead frame body 1010 as the lead frame 1020 extends from beyond the lead frame body 1010 into the body cavity 1012. This portion is referred to as the first portion. In FIGS. 9 and 10, the lead frame 1020 is highlighted using cross hatches for even more clear illustration of the lead frame 1020 in relation to the lead frame body 1010. Such encasing configuration is often referred to as over molding.

For ease of discussion, various portions of the lead frame 1020 may be referenced using an alphabetical letter following the lead frame reference number 1020. For example, the portion of the lead frame 1020 extending into the body cavity 1012 is referred to as the inner end 1020A of the lead frame 1020. In generally, reference number 1020 indicates the lead frame 1020 as a whole or in general.

The inner end 1020A of the lead frame 1020 is engaged to metal traces 1052 of the heat spreader 1050. In the illustrated embodiment, the inner end 1020A of the lead frame 1020 is soldered on to the metal traces 1052 of the heat spreader 1050. The soldering method can be any suitable method, for example, solder reflow process in which a small dot of solder paste is heated to its melting temperature; thus, the inner end 1020A and the traces 1052 are bonded by a robust solder joint.

Here, the lead frame body 1010 acts as an alignment fixture between all the lead frame 1020 and corresponding metal circuit traces 1052, soldering of all of the light emitting elements 1080 to the heat spreader 1050 can be done simultaneously. This simplifies the process time and reduces the exposure of LEDs to heat more than once. Furthermore, the lead frame body 1010 provides for electrical isolation and alignment between multiple leads of the lead frame 1020.

Outer ends 1020B of the lead frame are adapted to be connected to an external electrical power supply. The lead frame 1020 can be bent or formed into various shape to suit the mounting requirements. Similarly, other portions 1020C may extend out of the body for other purposes such as, for example only, mounting or engaging with additional components not illustrated herein.

One embodiment of the reconfigured light emitting module 1000 of FIGS. 1 and 2 are illustrated in FIGS. 11 through 13 as the light emitting module 1100. The light emitting module 1100 has the same elements or components as the light emitting module 1000 of FIGS. 1 and 2; however, its lead frame 2010 is bent 90 degrees (orthogonal) to facilitate solder connections with its electrical components located behind the optical front face of the module; and also to provide an easy engagement with thermal or mechanical component, such as, for example only, an intermediate heat sink 1090 illustrated in FIGS. 16 through 24 and discussed in more detail herein below. The orthogonal bent is 90 degrees relative to a plane defined by the first major surface 1016 defined by the lead frame body 1010. However, the degree of the bent angle is not limited to 90 degrees in the present invention.

This bent configuration allows the light emitting module 1100 to be snapped into another assembly with its snap in body structure shown in the Figures and discussed below. This facilitates its manufacturing process resulting lower manufacturing costs and times.

Once assembled with the intermediate heat sink 1090, the entire assembly, or can be the core component of general lighting applications such as, for example only, and without limitation, light bulbs, lighting luminairs, street lights or parking light modules.

Snap in Body

A snap in body 1030 can be used to provide additional structural support the lead frame 1020 as well as electrical isolation between the leads of the lead frame 1020. As illustrated, the snap in body 1030 engages or surrounds a second portion of the lead frame 1020 that is proximal to the outer ends 1020B of the lead frame 1020. The snap in body 1030 may include potions such as snap in finger 1030A to securely engage with other components such as an intermediate heat sink to be discussed below. A stopper 1030B portion of the snap in body 1030 allows the snap in body 1030 to be secured with a mating component such as an intermediate heat sink illustrated in FIGS. 16 through 24.

Heat Spreader

The heat spreader 1050 is connected to the lead frame 1020 as indicated in Figures, and most clearly in FIGS. 9 and 10. The layers associated with the heat spreader 1050 and its connection to the lead frame 1020 is discussed in more detail herein below.

At least one light emitting element 1080 is placed on the heat spreader 1050. In the illustrated embodiment, the light emitting module 1000 includes six (6) light emitting diode packages (LEDs). Each diode package includes at least one light emitting chip encapsulated in an encapsulant, e.g. silicone or epoxy. In alternative embodiments, each light emitting element 1080 may have at least one raw light emitting chip. Each light emitting element 1080 can have a few LED chips of any color or a mixture of different color or size. Moreover, the different colors and sizes of light emitting element 1080 that can be placed on the heat spreader 1050 is only limited by its physical and electrical limitations, and, depending on applications, can be very large.

If light emitting chips are used as the light emitting elements 1080, then die attach of chips is fabricated on the heat spreader 1050 followed by wire bonding and finally by an encapsulation process. In this configuration, the heat spreader 1050 also serves as the substrate for multiple light emitting chips. Also, the encapsulation process can be simple due to its large optical lens that can be placed over the entire body cavity 1012 and then filled with silicone gel to optically couple it to all the light emitting elements under it. The encapsulant can be filled with phosphors to alter the wavelengths of the LED chips mounted on the heat spreader. Or, the encapsulant can be loaded with some fine particles of reflective materials such as, for example only, Titanium Dioxide (TiO2), Barium Sulfate (BaSO4), and others.

The heat spreader 1050 can be made of any thermally conductive material, for example, ceramics or Aluminum coated with dielectric. Other examples of suitable materials for the heat spreader 1050 include, without limitation, ceramics such as Alumina, Aluminum Nitride, or Anodized Aluminum.

Dimensions of the heat spreader 1050 can vary greatly. For example, the heat spreader 1050 may have thickness ranging from sub-millimeters (mm) to many centimeters (cm). In the illustrated embodiment, the heat spreader 1050 thickness ranges from below one (1) mm to a few mm depending on size and requirements.

FIG. 14 illustrates an exploded side view of a first alternative embodiment of the heat spreader 1050 and is referred to herein as the heat spreader 1050A. Referring to FIGS. 1 to 14 but mostly FIG. 14, the heat spreader 1050A includes a substrate 1054A made with ceramics. The substrate 1054A has a first major surface 1056 and a second major surface 1058 opposite the first major surface 1056. The metal trace layer 1052 is fabricated on the first major surface 1056. The metal trace 1052 is adaptable for attaching light emitting elements 1080.

Additionally, the metal trace 1052 is adaptable for attaching the inner end 1020A of the lead frame 1020. Because the substrate 1054A is ceramic (thereby electrically insulating), no insulating material is needed to isolate the substrate 1054A from the traces 1052. A metal layer 1060 is fabricated on the second major surface 1058. The metal layer 1060 allows for solder attachment of the heat spreader 1050 to the intermediate heat sink 1090 illustrated in FIGS. 16 through 24 and discussed in more detail herein below. Then, a solder layer 1062 is used to bond the heat spreader 1050 to the intermediate heat sink 1090. This solder layer 1062 can be, but is not required to be lead free. Lead free solder has typical thermal conductivity of approximately 57 watts per meter degrees Kevin. This is significantly higher than other methods of heat contact. A solder layer 1062 is used to solder the heat spreader 1050A onto an intermediate heat sink 1090 illustrated in FIGS. 16 through 24 and discussed in more detail herein below. Soldering the heat spreader 1050A creates a much better thermal contact (between the heat spreader 1050A and the intermediate heat sink 1090) compared to the currently used technique of screw attachment.

FIG. 15 illustrates an exploded side view of a second alternative embodiment of heat spreader 1050 and is referred to herein as the heat spreader 1050B. Referring to FIGS. 1 to 15 but mostly FIG. 15, the heat spreader 1050B includes a substrate 1054B made with Aluminum. Dielectric layers 1064 and 1066 include insulation materials such as, for example, Aluminum oxide. The insulation layers can be fabricated using anodizing process. This prevents the traces 1052 from shorting out. Again, the substrate 1054B and with its dielectric layers 1064 and 1066 has a first major surface 1056 and a second major surface 1058 opposite the first major surface 1056. The metal trace layer 1052 is fabricated on the first major surface 1056's dielectric layer 1064 using a combination of a thin-film and plating processes. The metal trace 1052 may consist of Titanium, Nickel, Copper, Nickel, and Gold for example only and is adaptable for soldering to the light emitting elements 1080. Additionally, the metal trace 1052 is adaptable for soldering to the inner end 1020A of the lead frame 1020.

There is no bonding adhesive needed on an anodized Aluminum for bonding the traces 1052 to the dielectric layer 1064. In the illustrated embodiment, the thickness of Anodized layer is in the region of 33-55 microns approximately. As the Aluminum oxide layers 1064 and 1066 have a high thermal conductivity of about 18 Watt per Meter-degree Kelvin, the thermal conductivity of the Anodized Aluminum is much higher compared to the thermal conductivity of MCPCB (metal-core printed circuit boards) often used in the prior art lighting modules. The existing designs using MCPCB typically has lower thermal conductivity of less than 2 Watt per Meter-degree Kelvin. Accordingly, the present invention provides for higher thermal conductivity to remove heat away from the light emitting elements 1080 compared to that of the existing art.

An anodized aluminum heat spreader 1050B uses its aluminum oxide layer 1064 and 1066 as natural dialectical layers. In contrast, MCPCB of the prior art uses organic dielectric layers as a dielectric.

In the illustrated embodiment, the anodized Aluminum oxide dielectric layers 1064 and 1066 are approximately 33 microns to 55 microns thick and their thermal conductivity is approximately 18 Watt per Meter-degree Kelvin. In contrast, the organic dielectric layers of MCPCB as typically 75 microns to 125 microns thick and their thermal conductivity is in the range of approximately 2 Watt per Meter-degree Kelvin. Hence, anodized Aluminum heat spreader 1050 of the present invention has a much superior thermal conducting performance.

A metal layer 1060 is fabricated on the second major surface 1058's dielectric layer 1066. Again, the metal layer 1060 allows for solder attachment of the heat spreader 1050 to the intermediate heat sink 1090. A solder layer 1062 is used to solder the heat spreader 1050B onto an intermediate heat sink 1090 illustrated in FIGS. 16 through 24 and discussed in more detail herein below. Soldering the heat spreader 1050 creates a much better thermal contact (between the heat spreader 1050 and the intermediate heat sink 1090) compared to the currently used technique of screw attachment with less contact surface area and with a high interface resistance.

In one example embodiment, the heat spreader 1050 is made of Aluminum with a top surface area of 174 $mm^2$ and a thickness of 0.63 mm. With six light emitting elements 1080 soldered on the metal traces 1052, each requiring about 1 $mm^2$ area, the surface area ratio of the heat spreader 1050 to that of the light emitting elements 1080 is 174 to 6, or approximately 29 to 1. As such, its thermal spreading resistance is almost zero.

The heat spreader 1020 and the light emitting elements 1080, combined, are referred to herein as the heat spreading lighting component.

Intermediate Heat Sink

Figure 16:
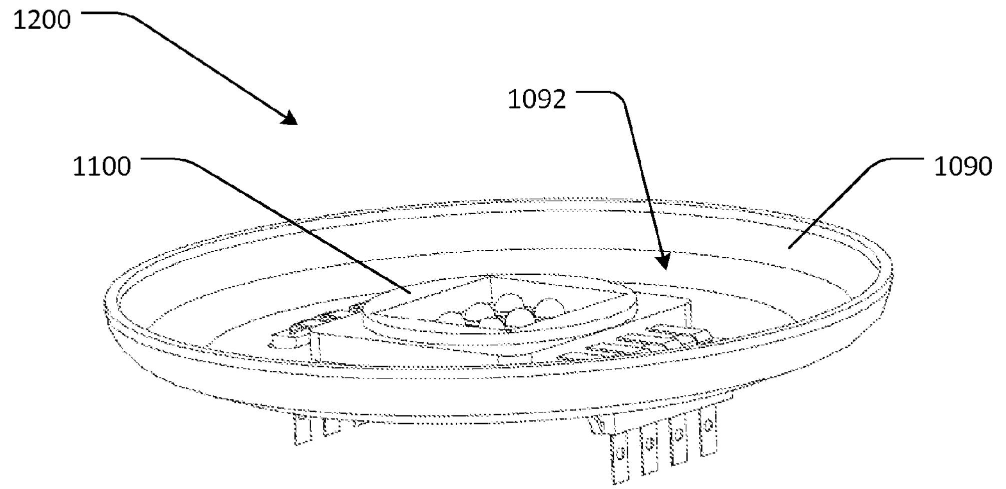
FIG. 16 illustrates a top perspective view of a subassembly in accordance with another embodiment of the present invention.
Figure 17:
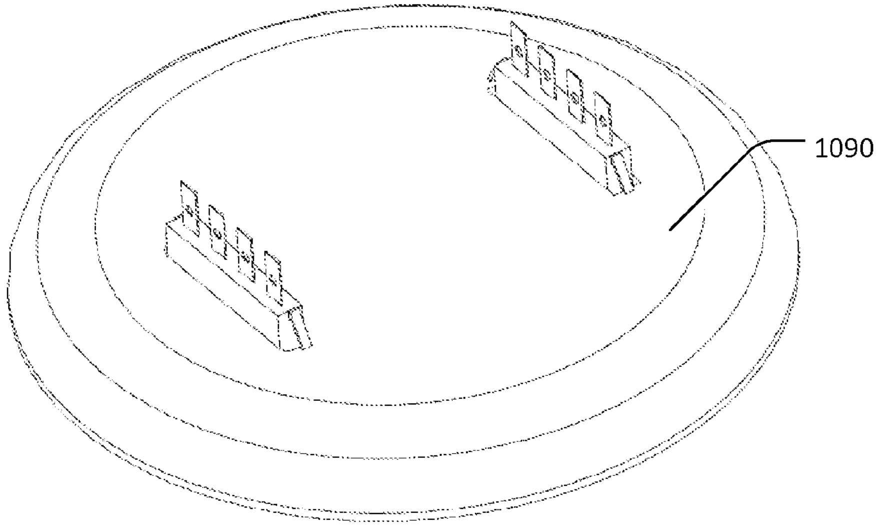
FIG. 17 illustrates a bottom perspective view of the subassembly of FIG. 16.
Figure 18:
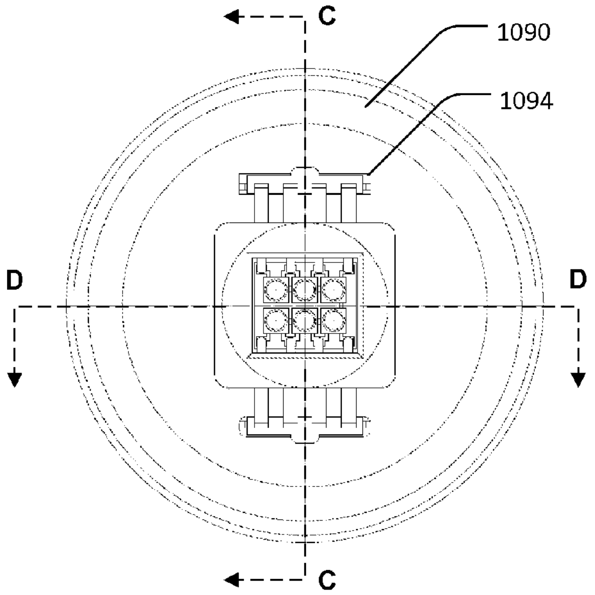
FIG. 18 illustrates a top view of the subassembly of FIGS. 16 and 17.
Figure 20:
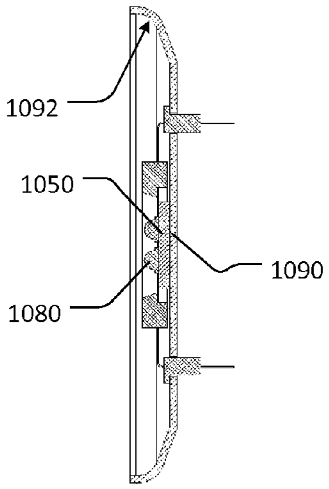
FIG. 20 illustrates a cut away side view of the subassembly of FIG. 18 cut along line C-C.
Figure 21:
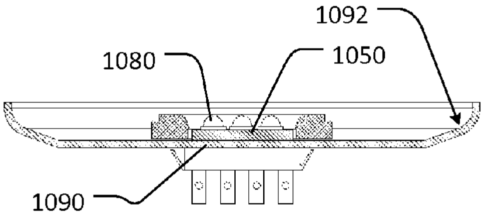
FIG. 21 illustrates a cut away side view of the subassembly of FIG. 18 cut along line D-D.
Figure 19:
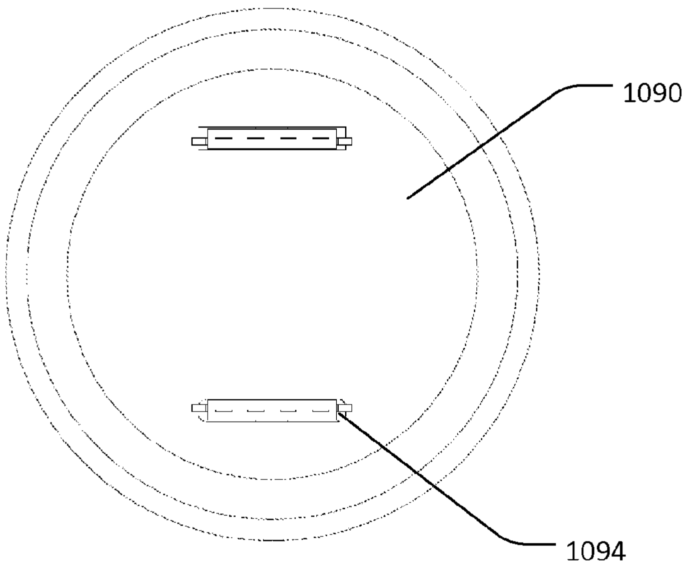
FIG. 19 illustrates a bottom view of the subassembly of FIGS. 16 and 17.

FIG. 16 illustrates a top perspective view of a light emitting subassembly 1200 in accordance with another embodiment of the present invention. FIG. 17 illustrates a bottom perspective view of the light emitting subassembly 1200 of FIG. 16. FIG. 18 illustrates a top view of the light emitting subassembly 1200 of FIGS. 16 and 17. FIG. 19 illustrates a top view of the light emitting subassembly 1200 of FIGS. 16 and 17. FIG. 20 illustrates a cut away side view of the light emitting subassembly 1200 of FIG. 18 cut along line C-C. FIG. 21 illustrates a cut away side view of the light emitting subassembly 1200 of FIG. 18 cut along line D-D.

Referring to FIGS. 16 through 21, the subassembly 1200 includes an intermediate heat sink 1090 and at least one light emitting module 1100 mounted on the intermediate heat sink 1090. The light emitting module 1100 is the same light emitting module of FIGS. 11 through 13 and discussed herein above in more detail.

The intermediate heat sink 1090 is soldered (structurally and thermally connected) to the heat spreader 1050. The heat spreader 1050, in turn, is soldered (structurally and thermally connected) to the light emitting elements 1080. This is most clearly illustrated in FIGS. 20 and 21. Accordingly, heat generated by the light emitting elements 1080 is drawn away from the light emitting elements 1080 by the heat spreader 1050. The heat is then drawn away from the heat spreader 1050 by the intermediate heat sink 1090.

The intermediate heat sink 1090 may have any shape and size depending on the final product design requirements. In the illustrated embodiment, the intermediate heat sink 1090 is made of metal such as, for example only, copper alloy or aluminum alloy, and can be plated with nickel. Such plating allows for easier soldering of the heat spreader 1050 to the intermediate heat sink 1090. The intermediate heat sink 1090 defines slots 1094 to allow portions of the light emitting module 1100 to pass through the slots and thereby engage the intermediate heat sink 1090. Further, the slots 1094 aid in alignment of the intermediate heat sink 1090 to the light emitting module 1100. Using this alignment technique, the manufacturing process is less labor intensive compared to the manufacturing process of the existing products. This results in higher yield and lower cost of assembly.

The intermediate heat sink 1090 is covered by an optical reflective element or itself coated with reflective materials on the top side 1092 to form a reflective bowl to reflect and recycle light thereby minimizing loss of light. The reflective material or component may have a mirror finished Aluminum or a silver coating having thickness of a few Angstroms.

In the illustrated embodiment, the heat generated by the light emitting elements 1080 is drawn away from the light emitting elements 1080 by the heat spreader 1050 that spreads the heat into its own body which has a much greater thermal mass than the light emitting elements 1080. Further down along the thermal path, the heat is conducted to the intermediate heat sink 1090 which dimensions and surface areas are many times that of the heat spreader 1050. Consequently, the heat generated by the light emitting elements 1080 is effectively removed from the light emitting elements 1080 thereby reducing adverse effects of heat on the light emitting elements 1080 such as reduction of luminous output, damage to the LED chips, and ultimately shortened service life.

Figure 22:
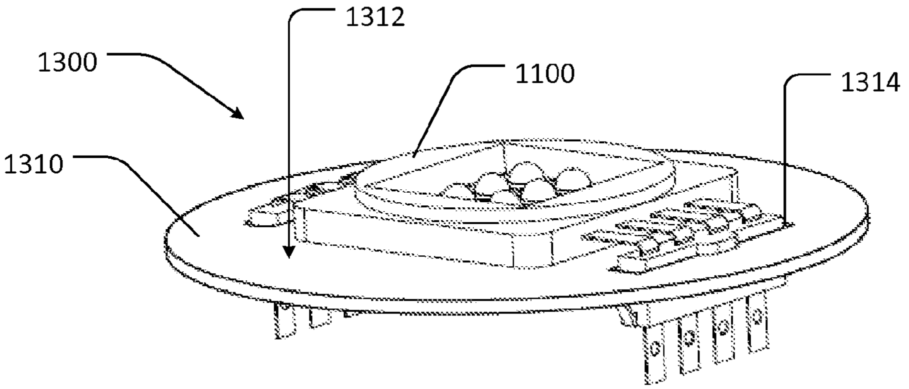
FIG. 22 illustrates a top perspective view of a subassembly in accordance with yet another embodiment of the present invention.

FIG. 22 illustrates a top perspective view of a light emitting subassembly 1300 in accordance with another embodiment of the present invention. Referring to FIG. 22, the subassembly 1300 includes an intermediate heat sink 1310 and at least one light emitting module 1100 mounted on the intermediate heat sink 1310. The light emitting module 1100 is the same light emitting module of FIGS. 11 through 13 and discussed herein above in more detail.

The intermediate heat sink 1310 is substantially flat in the illustrated embodiment as opposed to a bowl shaped intermediate heat sink 1090 (of FIGS. 16 through 21). Further, the intermediate heat sink 1310 generally has a flat cylindrical shape. However, the intermediate heat sink 1310 is similar to the intermediate heat sink 1090 (of FIGS. 16 through 21) in composition and function. For example, the intermediate heat sink 1310 is made of thermally conductive material such as metal alloy. Further, the intermediate heat sink 1310 has a top surface 1312 that is coated with reflective material. Also, the intermediate heat sink 1310 defines slots 1314 used to aid in the engagement of and alignment with the intermediate heat sink 1310 with the one light emitting module 1100.

Figure 23:
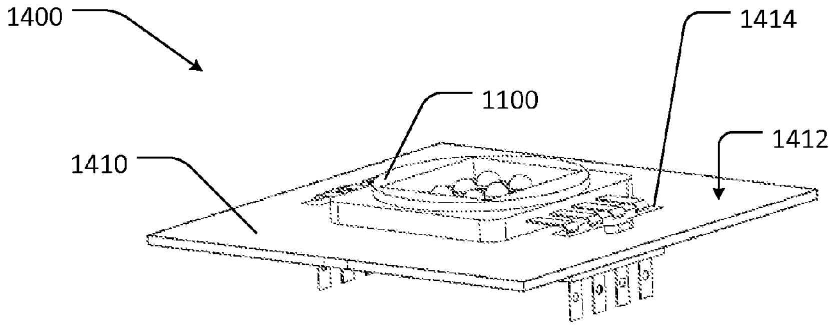
FIG. 23 illustrates a top perspective view of a subassembly in accordance with yet another embodiment of the present invention.

FIG. 23 illustrates a top perspective view of a light emitting subassembly 1400 in accordance with yet another embodiment of the present invention. Referring to FIG. 23, the subassembly 1400 includes an intermediate heat sink 1410 and at least one light emitting module 1100 mounted on the intermediate heat sink 1410. The light emitting module 1100 is the same light emitting module of FIGS. 11 through 13 and discussed herein above in more detail.

The intermediate heat sink 1410 is substantially flat in the illustrated embodiment as opposed to a bowl shaped intermediate heat sink 1090 (of FIGS. 16 through 21). Further, the intermediate heat sink 1410 generally has a rectangular prism shape. However, the intermediate heat sink 1410 is similar to the intermediate heat sink 1090 (of FIGS. 16 through 21) in composition and function. For example, the intermediate heat sink 1410 is made of thermally conductive material such as metal alloy. Further, the intermediate heat sink 1410 has a top surface 1412 that is covered with an optical reflective element or itself coated with reflective material. Also, the intermediate heat sink 1410 defines slots 1414 used to aid in the engagement of and alignment with the intermediate heat sink 1410 with the one light emitting module 1100.

Figure 24:
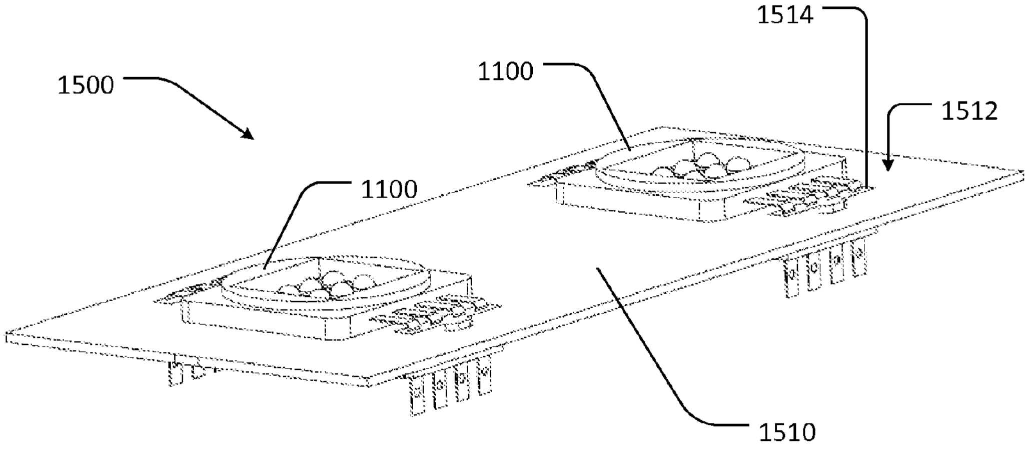
FIG. 24 illustrates a top perspective view of a subassembly in accordance with yet another embodiment of the present invention.

FIG. 24 illustrates a top perspective view of a light emitting subassembly 1500 in accordance with yet another embodiment of the present invention. Referring to FIG. 24, the subassembly 1500 includes an intermediate heat sink 1510 and at least one light emitting module 1100 mounted on the intermediate heat sink 1510. In fact, in the illustrated embodiment, the light emitting subassembly 1500 includes two light emitting modules 1100. The light emitting module 1500 is the same light emitting module of FIGS. 11 through 13 and discussed herein above in more detail.

Again, the intermediate heat sink 1510 is substantially flat in the illustrated embodiment as opposed to a bowl shaped intermediate heat sink 1090 (of FIGS. 16 through 21). Further, the intermediate heat sink 1510 generally has a rectangular prism shape. However, the intermediate heat sink 1510 is similar to the intermediate heat sink 1090 (of FIGS. 16 through 21) in composition and function. For example, the intermediate heat sink 1510 is made of thermally conductive material such as metal alloy. Further, the intermediate heat sink 1510 has a top surface 1512 that is covered with an optical reflective element or itself coated with reflective material. Also, the intermediate heat sink 1510 defines slots 1514 used to aid in the engagement of and alignment with the intermediate heat sink 1510 with the one light emitting module 1100.

The intermediate heat sink 1090, 1310, 1410, 1510 transfers heat from the heat spreader 1050 to an ultimate heat sink. The ultimate heat sink, in many applications, is the body of the lighting device such as the light bulb that includes light emitting subassembly 1200, 1300, 1400, and 1500. At the body of the lighting device, the heat is dissipated, often by convention to the surrounding air, or even to other heat dissipating mechanisms such as an external heat sink.

Thermal Path

Referring to FIGS. 1 through 24, and more specifically to FIGS. 16 through 24, as illustrated, the thermal path of heat generated by the light emitting elements 1080 is drawn away from the light emitting elements 1080 by the heat spreader 1050 that spreads the heat into its own body which has a much greater thermal mass than the light emitting elements 1080. At the same time, the heat is then conducted to the intermediate heat sink 1090 which has even greater dimensions than the dimensions of the heat spreader 1020 as well as much greater surface area. Consequently, the heat generated by the light emitting elements 1080 is effectively removed from the light emitting elements 1080 thereby reducing adverse effects of heat on the light emitting elements 1080 such as reduction of luminous output, damage to the light emitting elements 1080, and ultimately shortened service life.

For subassemblies 1200, 1300, 1400, 1500 where its included heat spreader 1050A has the configuration illustrated in FIG. 14, the thermal path from the light emitting elements 1080 to the intermediate heat sink 1090, 1310, 1410, 1510 is as follows: the heat flux flows from light emitting element 1080 in the following sequence to the solder, the metal traces 1052, the ceramic substrate 1054A, the metal layer 1060, the solder 1062, and finally to the intermediate heat sink 1090, 1310, 1410, 1510.

For subassemblies 1200, 1300, 1400, 1500 where its included heat spreader 1050B has the configuration illustrated in FIG. 15, the thermal path from the light emitting elements 1080 to the intermediate heat sink 1090, 1310, 1410, 1510 is as follows: the light emitting element 1080 to solder to metal traces 1052 to dielectric layer 1064 to substrate

1054B to dielectric layer 1066 to metal layer 1060 to solder 1062 to the intermediate heat sink 1090, 1310, 1410, 1510.

For example, in experiments and test, it has been demonstrated that an Alumina heat spreader 1050 having a top surface area of approximately 150 square mm and a thickness of 0.63 mm, can effectively provide negligible spreading thermal resistance for a six light emitting elements, each element including 1 to 2 watt LED packages. Only where LED chips are clustered very close together, a better thermal conductive ceramics such as AlN or anodized aluminum is used.

Assembly, Construction, and Additional Advantages

Referring to FIGS. 1 through 24, and more specifically to FIGS. 14, 15, 20, and 21, it has already been discussed that the light emitting elements 1080 are soldered onto the metal traces 1052 of the light emitting modules 1000 and 1100 and that the heat spreader 1050 is soldered onto the intermediate heat sinks 1090, 1310, 1410, and 1510.

In the present invention, the illustrated designs allow for use of solder reflow technique to solder all the light emitting elements 1080 to the metal traces 1052 and all the lead frame 1020 and heatsink spreader 1050 to the intermediate heatsink 1090, 1310, 1410 or 1510 all at the same time. That is, only one or at most two soldering cycles are required to solder all the light emitting elements 1080 to form a thermally efficient subassembly. This is a significant advantage over the existing art where hot-bar soldering technique are necessary to solder loose wires from power supply to a MCPCB (metal core printed circuit board) where light emitting diode packages are soldered first. Further, in the present invention, during a single or two solder reflow cycles, the light emitting elements 1080 are exposed only to its allowable peak temperature and time duration, hence protected from overheating and over exposure. These factors reduce the risk of damaging light emitting elements 1080 during the manufacturing process.

Also, in manufacturing, the first solder reflow process can be carried out to solder all light emitting elements 1080 to the heat spreader 1050, then the second solder reflow process is to solder the heat spreader 1050 to lead frame 1020 and the intermediate heat sink all at once. The same solder alloy can be used for both reflow processes because the solder from the first solder reflow has absorbed other metals as impurities and will not melt during the second solder reflow. Hence, the light emitting elements 1080 will not be unsoldered during the second reflow by the same eutectic soldering temperature again.

The present invention has a number of potential applications including lighting products such as light bulbs of any wattage and of various luminous performance and physical size and connection. Such device can be built more cheaply than the existing technology having the same luminous performance. Its 3-dimensional modular design can serve as a light engine for any conceivable lighting product such as street light, stadium light, industrial light, security light or any illumination product.

CONCLUSION

From the foregoing, it will be appreciated that the present invention is novel and offers advantages over the existing art. Although a specific embodiment of the present invention is described and illustrated above, the present invention is not to be limited to the specific forms or arrangements of parts so described and illustrated. For example, differing configurations, sizes, or materials may be used to practice the present invention.

I claim:

1. A light emitting module, the module comprising:

a lead frame body, said lead frame body defining a cavity;

lead frame wherein first portions of said lead frame are encased within said lead frame body, and said lead frame having second portions;

a heat spreader positioned at least partially within the cavity of said lead frame body, said heat spreader connected to said lead frame;

at least one light emitting element placed on said heat spreader; and a first snap in body engaging the second portions of said lead frame.

2. The module recited in claim 1 where said lead frame body includes a first major surface, the first major surface defining a first plane, and wherein said lead frame is bent relative to the first plane.

3. A light emitting module, the module comprising:

a lead frame body, said lead frame body defining a cavity;

lead frame wherein first portions of said lead frame are encased within said lead frame body;

a heat spreader positioned at least partially within the cavity of said lead frame body, said heat spreader connected to said lead frame;

at least one light emitting element placed on said heat spreader;

wherein said heat spreader comprises:

a ceramic substrate having a first major surface and a second major surface opposite the first major surface;

a metal trace layer fabricated on the first major surface;

said metal trace adaptable for attaching light emitting element; and said metal trace adaptable for attaching said lead frame.

4. A light emitting module, the module comprising:

a lead frame body, said lead frame body defining a cavity;

lead frame wherein first portions of said lead frame are encased within said lead frame body;

a heat spreader positioned at least partially within the cavity of said lead frame body, said heat spreader connected to said lead frame;

at least one light emitting element placed on said heat spreader;

wherein said heat spreader comprises:

a metallic substrate;

a first dielectric layer above said metallic substrate;

a second dielectric layer below said metallic substrate;

a metal trace layer fabricated on the first dielectric layer;

a metal layer fabricated below the second dielectric layer;

said metal trace adaptable for attaching light emitting element; and said metal trace adaptable for attaching said lead frame.

5. The module recited in claim 4 wherein said light emitting element comprises light emitting diode (LED) encased within resin.

6. The module recited in claim 5 first comprising a first LED emitting light having a first color and a second LED emitting light having a second color.

7. The module recited in claim 4 wherein said light emitting element comprises light emitting diode (LED) chip.

8. The module recited in claim 7 first comprising a first LED chip emitting light having a first color and a second LED chip emitting light having a second color.

9. The module recited in claim 7 first comprising encapsulant encasing the LED chip.

10. The module recited in claim 9 wherein said encapsulant including phosphors to modify wavelengths of light emitted by said LED chip.

11. The module recited in claim 9 wherein said encapsulant including diffusant to diffuse light emitted by said LED chip.

12. A light emitting subassembly, subassembly comprising:

an intermediate heat sink;

at least one light emitting module mounted on said intermediate heat sink;

wherein said light emitting module comprises:

a lead frame body defining a cavity;

lead frame wherein first portions of said lead frame are encased within said lead frame body;

a heat spreader positioned at least partially within the cavity of said lead frame body, said heat spreader connected to said lead frame;

at least one light emitting element placed on said heat spreader;

wherein said heat spreader is thermally connected to said intermediate heat sink; and wherein said intermediate heat sink defines slots for engagement with said light emitting module.

* * * * *